(12) United States Patent
Ohira et al.

(10) Patent No.: US 8,536,051 B2
(45) Date of Patent: Sep. 17, 2013

(54) MANUFACTURE METHOD FOR SEMICONDUCTOR DEVICE

(75) Inventors: Hikaru Ohira, Yokohama (JP); Tomoyuki Kirimura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 221 days.

(21) Appl. No.: 13/158,892

(22) Filed: Jun. 13, 2011

(65) Prior Publication Data

US 2012/0070974 A1 Mar. 22, 2012

(30) Foreign Application Priority Data

Sep. 8, 2010 (JP) ................................ 2010-200981

(51) Int. Cl.
*H01L 21/4763* (2006.01)
*H01L 21/311* (2006.01)
*H01L 21/461* (2006.01)

(52) U.S. Cl.
USPC ........... 438/637; 438/639; 438/700; 438/706; 438/709; 257/E21.143; 257/E21.218; 257/E21.311; 257/E21.577

(58) Field of Classification Search
USPC . 438/637, 639, 700, 706, 709; 257/E21.143, 257/E21.218, E21.311, E21.577
See application file for complete search history.

(56) References Cited

U.S. PATENT DOCUMENTS

| 2008/0292973 | A1* | 11/2008 | Stamper | 430/5 |
| 2009/0209109 | A1 | 8/2009 | Yaegashi et al. | |
| 2009/0286400 | A1* | 11/2009 | Heo et al. | 438/694 |
| 2010/0159669 | A1* | 6/2010 | Lee | 438/424 |

FOREIGN PATENT DOCUMENTS

JP 2009-218574 A 9/2009

* cited by examiner

*Primary Examiner* — Mohsen Ahmadi
(74) *Attorney, Agent, or Firm* — Westerman, Hattori, Daniels & Adrian, LLP

(57) ABSTRACT

A semiconductor device manufacture method includes: forming a first film above a semiconductor substrate; forming a first mask film above the first film; patterning the first mask film; executing a plasma process for a side wall of the patterned first mask film to transform the side wall into a transformed layer; after the plasma process, forming a second mask film covering the first mask film; etching the second mask film to remove the second mask film above the first mask film and leave the second mask film formed on the side wall; after the etching the second mask film, removing the transformed layer; and after the removing the transformed layer, etching the first film by using the first mask film and the second mask film as mask.

18 Claims, 23 Drawing Sheets

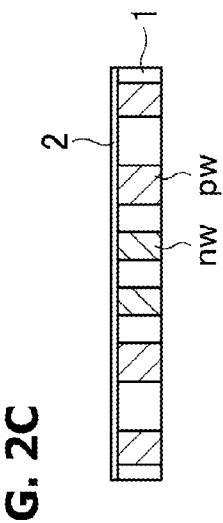
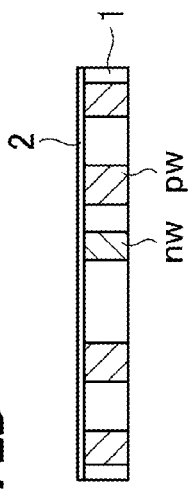
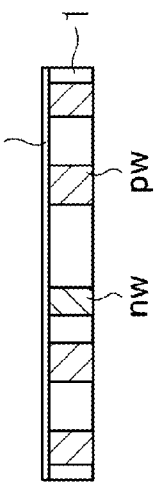
FIG. 2C
FIG. 2D
FIG. 2E
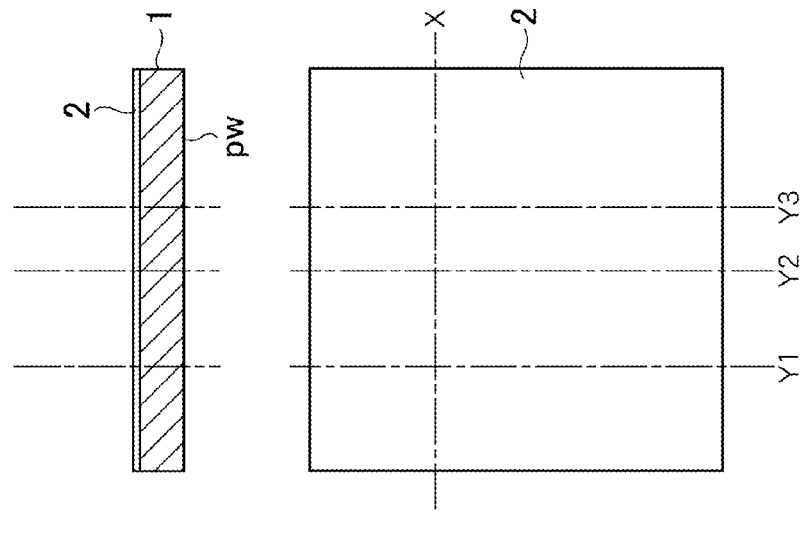
FIG. 2A
FIG. 2B

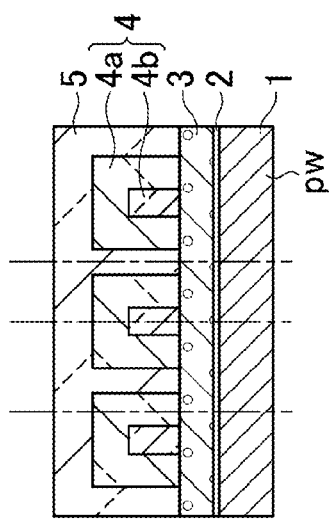
FIG. 7A
FIG. 7B
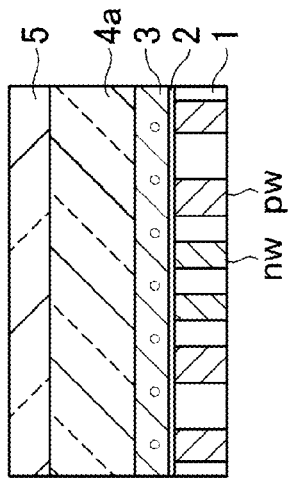
FIG. 7C
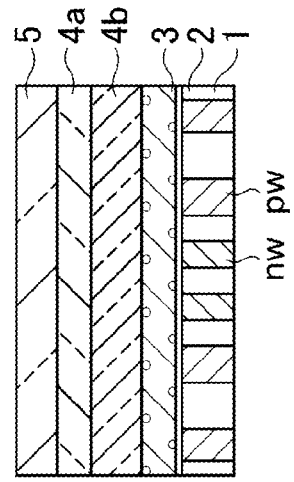
FIG. 7D
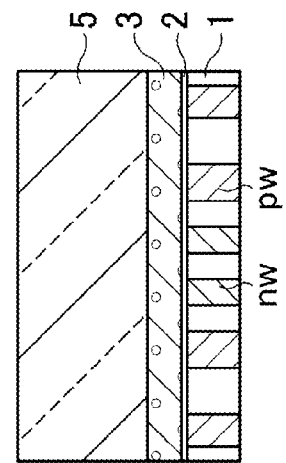
FIG. 7E

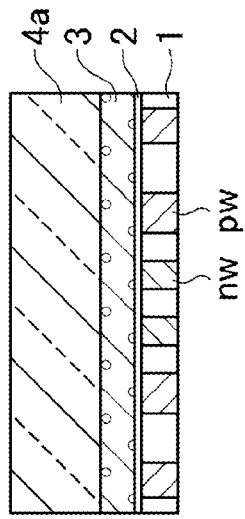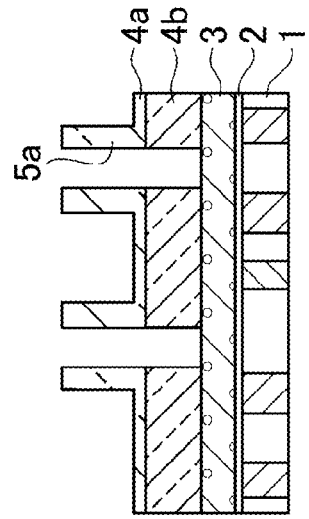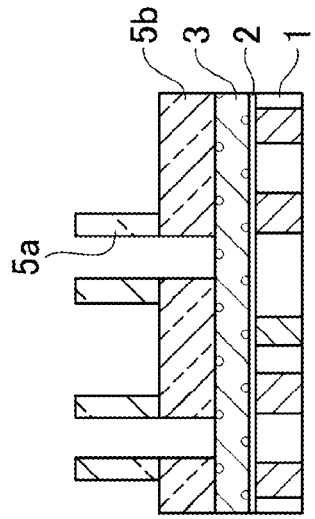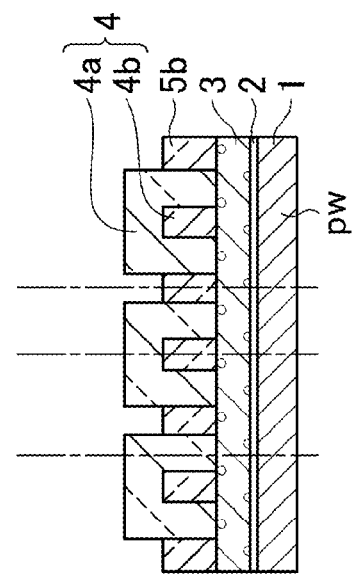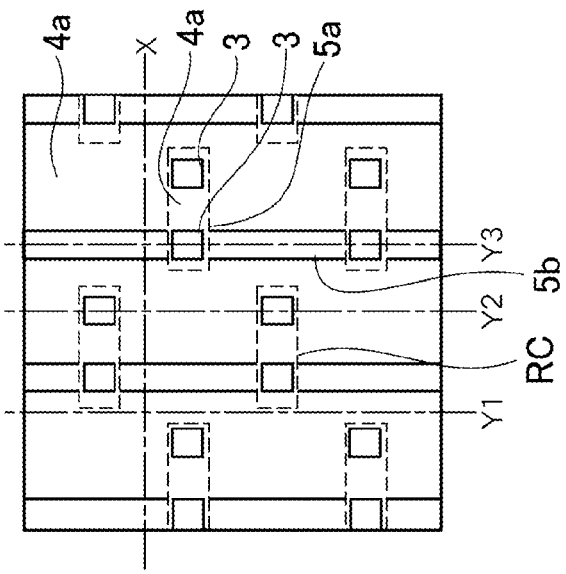

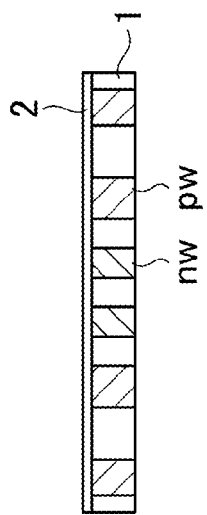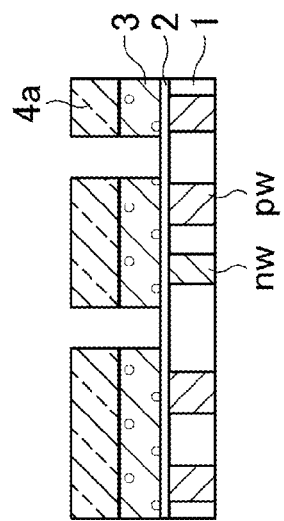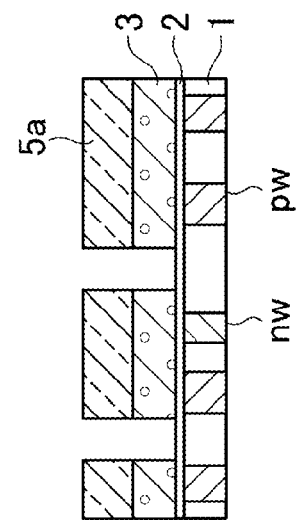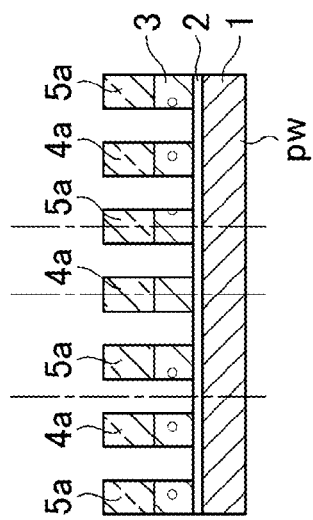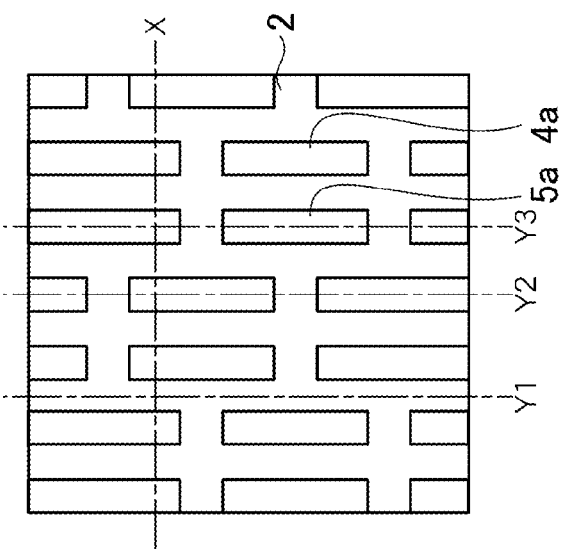

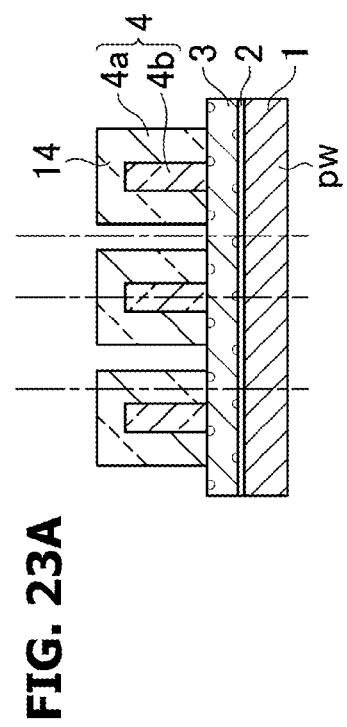
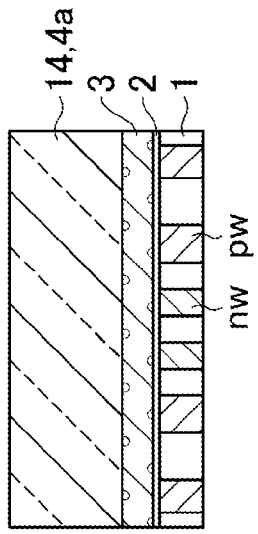
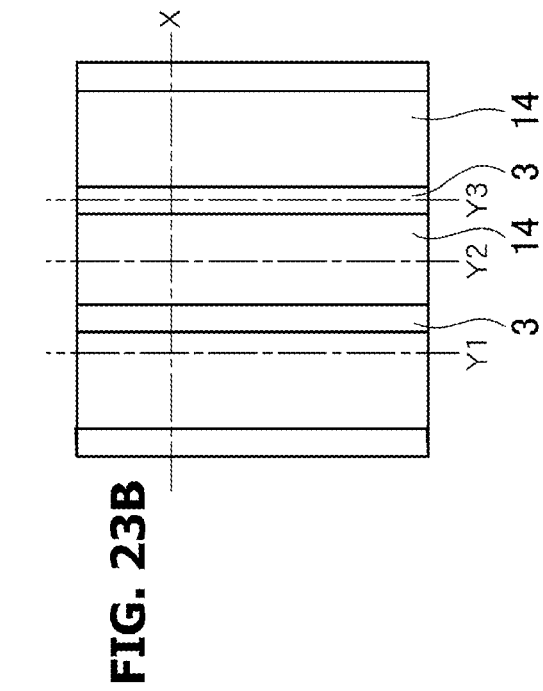
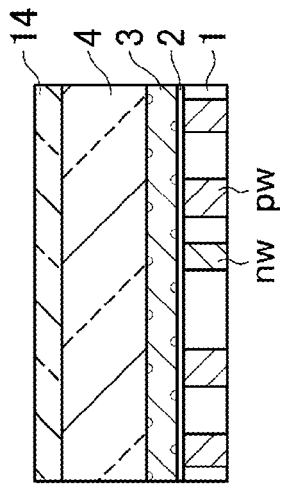
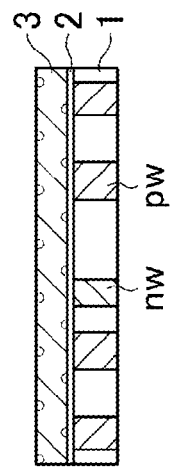

MANUFACTURE METHOD FOR SEMICONDUCTOR DEVICE

CROSS-REFERENCE TO RELATED APPLICATION

This application is based upon and claims the benefit of priority of the prior Japanese Patent Application No. 2010-200981, filed on Sep. 8, 2010, the entire contents of which are incorporated herein by reference.

FIELD

The embodiments discussed herein are related to a manufacture method for a semiconductor device.

BACKGROUND

Etching using a mask is performed to form a circuit pattern of a semiconductor device (for example, refer to Japanese Patent Laid-open Publication No. 2009-218574). As a circuit pattern becomes fine, a mask become also fine.

SUMMARY

According to one aspect of the invention, a semiconductor device manufacture method includes: forming a first film above a semiconductor substrate; forming a first mask film above the first film; patterning the first mask film; executing a plasma process for a side wall of the patterned first mask film to transform the side wall into a transformed layer; after the plasma process, forming a second mask film covering the first mask film; etching the second mask film to remove the second mask film above the first mask film and leave the second mask film formed on the side wall; after the etching the second mask film, removing the transformed layer; and after the removing the transformed layer, etching the first film by using the first mask film and the second mask film as mask.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A, 1B, 1C, 1D and 1E to FIGS. 3A, 3B, 3C, 3D and 3E, FIGS. 4A, 4B, 5A, 5B, and FIGS. 6A, 6B, 6C, 6D and 6E to FIGS. 17A, 17B, 17C, 17D and 17E are schematic plan views and schematic cross sectional views illustrating main processes of a semiconductor device manufacture method of a first embodiment.

FIGS. 18A, 18B, 18C, 18D and 18E to FIGS. 23A, 23B, 23C, 23D and 23E are schematic plan views and schematic cross sectional views illustrating main processes of a semiconductor device manufacture method of a second embodiment.

DESCRIPTION OF EMBODIMENTS

Description will be made first on the semiconductor device manufacture method of the first embodiment. In the first embodiment, a static random access memory (SRAM) is manufactured, and detailed description will be made on patterning for forming gate electrodes of MOS transistors among processes of forming SRAM circuits.

Figure 1A:
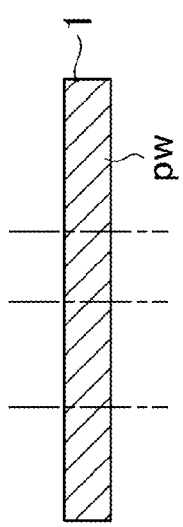
Figure 1B:
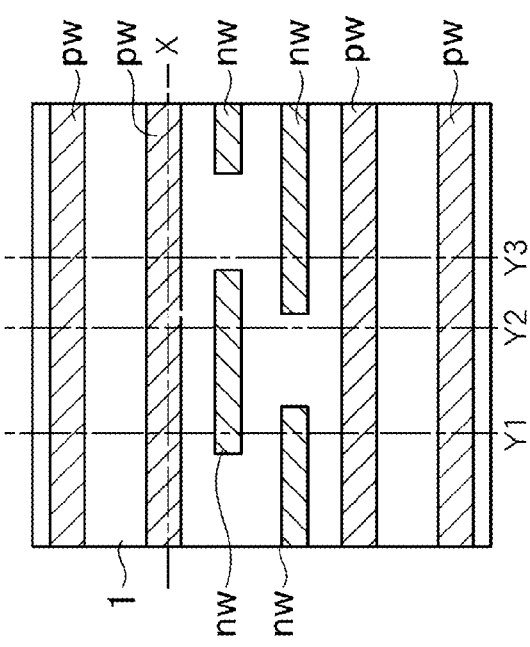
Figure 1C:
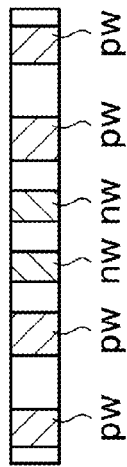
Figure 1D:
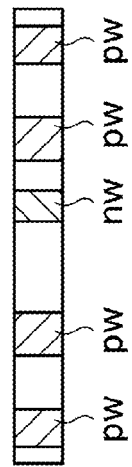
Figure 1E:
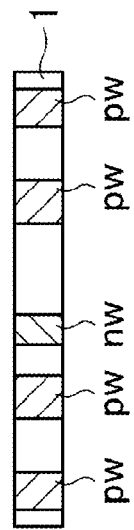
Figure 3C:
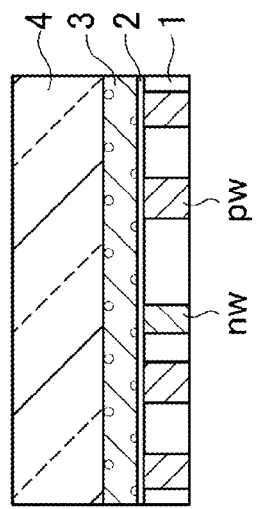
Figure 3D:
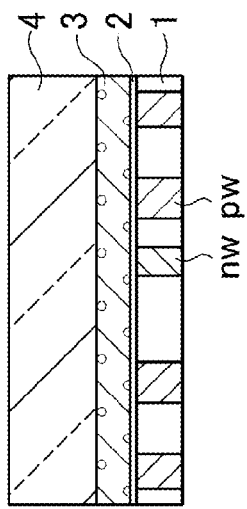
Figure 3E:
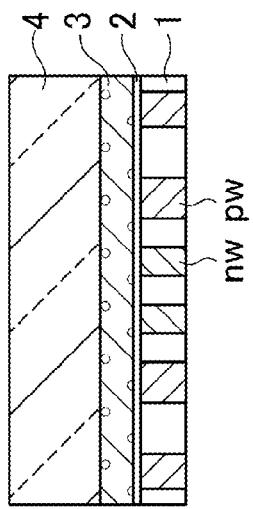
Figure 3A:
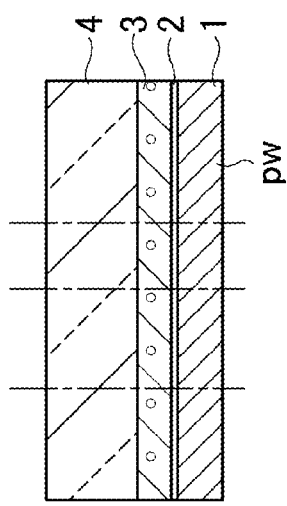
Figure 3B:
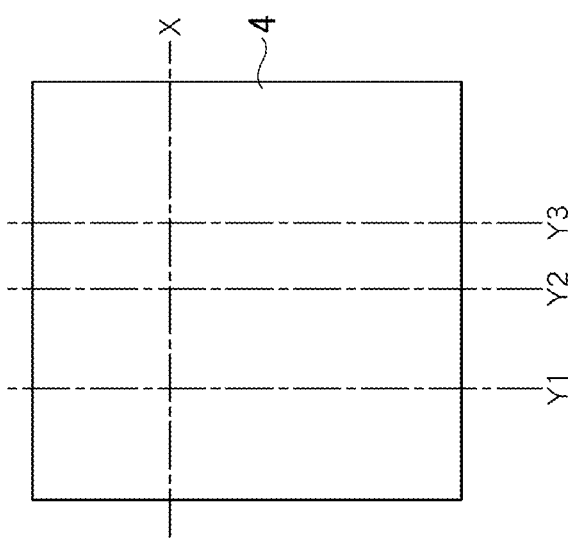

FIGS. 1 to 17 are schematic plan views and schematic cross sectional views illustrating main processes of a manufacture method for a semiconductor device of the first embodiment. "B" is added to a plan view like FIG. 1B, "A" is added to a cross sectional view along drawing sheet lateral direction taken along one-dot chain line X in the plan view like FIG. 1A, and "C", "D" and "E" are added to cross sectional views in the drawing sheet vertical direction taken along one-dot chain lines Y1, Y2 and Y3 in the plan view, like FIGS. 1C, 1D and 1E.

Figure 4A:
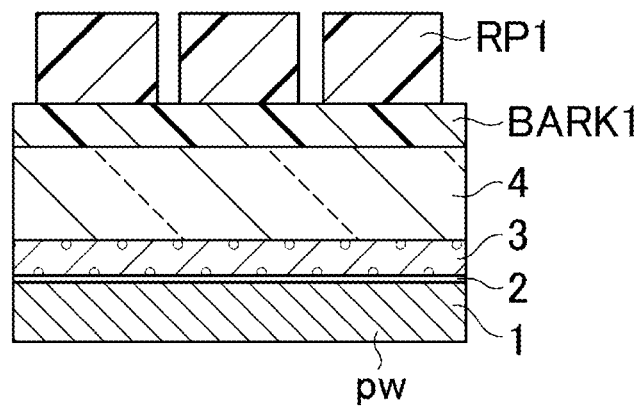
Figure 4B:
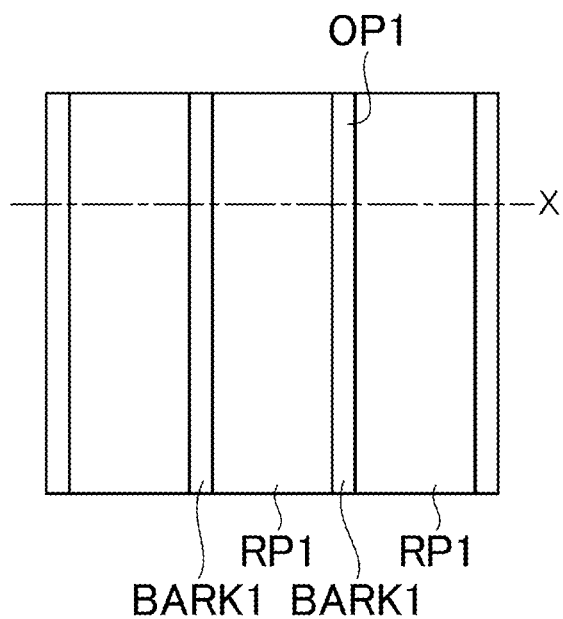
Figure 5A:
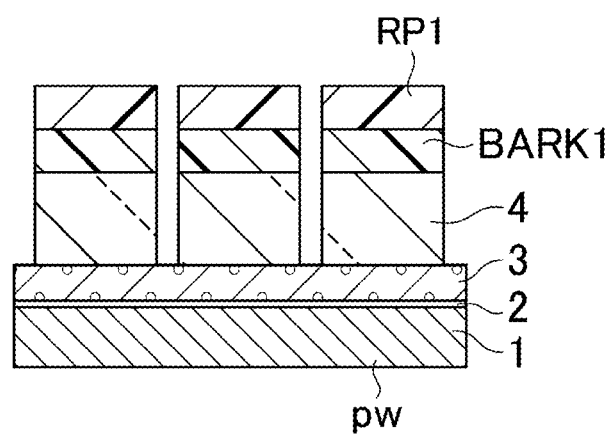
Figure 5B:
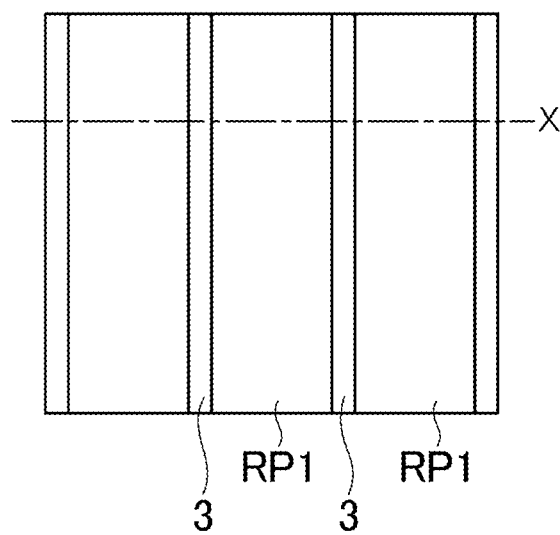

In order to avoid description complexity, the plan view added with "B" and cross sectional views added with "A", "C", "D", and "E" are collectively called a group of drawings. For example, FIGS. 1A to 1E are correctively called FIG. 1. This representation is also applied to the second embodiment to be described later. Only a plan view and a cross sectional view in the X direction are illustrated in FIGS. 4 and 5.

Reference is made to FIG. 1. An active region isolation insulating film is formed in a semiconductor substrate 1 (for example, p-type silicon substrate), for example, by shallow trench isolation to define active regions.

A photoresist film is formed on the semiconductor substrate 1, for example, by spin coating. Openings for exposing active regions for forming p-type MOS transistors are formed through the photoresist film by photolithography. By using this photoresist film as a mask, n-type impurities are introduced into the active regions for forming p-type MOS transistors, for example, by ion implantation to form n-type wells nw. The photoresist film used for forming the n-type wells nw are removed by ashing.

A photoresist film is formed on the semiconductor substrate 1, for example, by spin coating. Openings for exposing active regions for forming n-type MOS transistors are formed through the photoresist film by photolithography. By using this photoresist film as a mask, p-type impurities are introduced into the active regions for forming n-type MOS transistors, for example, by ion implantation to form p-type wells pw. The photoresist film used for forming the n-type wells pw is removed by ashing.

X-direction elongated p-type MOS transistor forming regions (n-type wells nw) and n-type MOS transistor forming regions (p-type wells pw) are disposed being juxtaposed in the Y-direction.

Reference is made to FIG. 2. For example, a silicon oxide film of 1.5 nm thick is formed on the semiconductor substrate 1 by thermal oxidation to form a gate insulating film 2.

Reference is made to FIG. 3. Conductive material is deposited on the gate insulating film 2, for example, by chemical vapor deposition (CVD) to deposit a polysilicon film of 100 nm thick and form a gate electrode film 3.

A mask film 4 is formed on the gate electrode film 3, for example, by coating. The mask film 4 is, e.g., an SiCOH film (e.g., nano-clustering silica (NCS) of porous silica). A thickness of the mask film 4 is e.g., 100 nm.

Reference is made to FIG. 4. An antireflection film BARK1 of organic material is formed on the mask film 4 by coating. A photoresist film is formed on the antireflection film BARK1 by coating. A pattern is transferred to the photoresist film by photolithography to form a resist pattern RP1. A thickness of the antireflection film BARK1 is e.g., about 70 nm, and a thickness of the resist pattern RP1 is e.g., about 150 nm.

The resist pattern RP1 is used for forming a mask for patterning the Y-direction elongated gate electrode in the width direction (X-direction). In this embodiment, a gate length direction along which the channel current flows is called a width direction (X-direction) of the gate electrode, and the gate width direction is called a length direction (Y-direction) of the gate electrode. As illustrated in FIG. 4B, the resist pattern RP1 defines an opening OP1 elongated in a length direction (Y-direction) of the gate electrode. A width of the opening OP1 is equal to the width of the gate electrode, and is e.g., 50 nm. A width of each portion of the resist pattern RP1 is equal to the width of the distance between one gate electrode and the second adjacent gate electrode, and is e.g., 190 nm.

Reference is made to FIG. 5. By using the resist pattern RP1 as a mask, the antireflection film BARK1 is etched, and by using the resist pattern RP1 and antireflection film BARK1 as a mask, the mask film 4 is etched until the gate electrode film 3 is exposed.

For example, the mask film 4 is etched by using a diode parallel plate dry etching system in a vacuum chamber. A substrate temperature during etching is set to, e.g., about 25° C. Etching gas may be a mixture gas of, e.g., $CF_4$, $CHF_3$ and Ar.

More specifically, gas ratio is set to a combination of 50 to 300, 10 to 100 and 0 to 1000 in the order of $CF_4$, $CHF_3$ and Ar, and a total flow rate of the mixture gas is set in a range of 200 sccm to 1000 sccm. A pressure in the chamber is set to, e.g., 10 mTorr to 300 mTorr. A frequency of a radio frequency power to be applied is set to, e.g., 13.56 MHz at about 100 W to about 1000 W. During etching, a mixture gas may be changed to a mixture gas of another combination.

Reference is made to FIG. 6. The resist pattern RP1 and antireflection film BARK1 are removed by ashing, i.e., by a plasma process using an oxygen containing gas. Gas used by the plasma process may contain at least one or more gases of $O_2$, CO and $CO_2$. At least one or more gases of $H_2$ and $N_2$ may be mixed to the process gas of the plasma process. More specifically, for example, $O_2$ gas is introduced at a flow rate of 500 sccm into the vacuum chamber of the diode parallel plate reactive ion etching system, and under a pressure of 250 mTorr a radio frequency power of 13.56 MHz and 500 W is applied to the diode parallel plate electrode to perform the plasma process for 60 seconds at a substrate temperature of 25° C.

With this plasma process, the resist pattern RP1 and antireflection film BARK1 are removed, and a transformed layer 4a is formed on the side walls and upper plane of the mask film 4 (the side walls and top plane of the mask film 4 are altered to the transformed layer 4a). The transformed layer 4a is formed as oxygen in the plasma process gas permeates from the surface of the mask film 4 to transform SiCOH into $SiO_2$. The mask film 4 is preferably a porous film from the view point of facilitating the permeation of oxygen.

The resist pattern RP1 and antireflection film BARK1 cover the top plane of the mask film 4 for a while after the start of the plasma process, and transformation progresses on the exposed side walls of the patterned mask film 4. As the antireflection film BARK1 is removed, transformation starts also on the upper plane of the mask film 4.

A thickness of the transformed layer 4a of the mask film 4 may be changed by adjusting the plasma process time. As will be later described with reference to, e.g., FIG. 14, non-transformed portions 4b are left as a mask for patterning the gate electrode film 3. In this embodiment, the plasma process time is selected in such a manner that a thickness of, e.g., 70 nm of the transformed layer 4a is left on the side walls of the mask film 4.

Figure 6C:
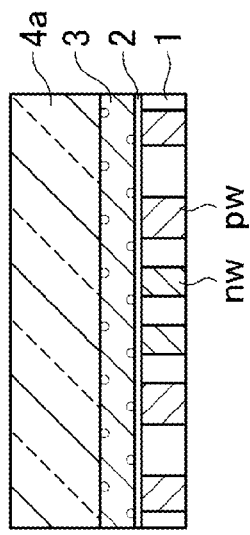
Figure 6D:
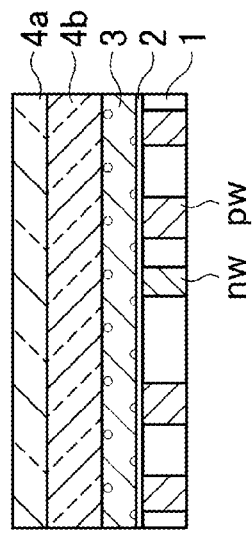
Figure 6E:
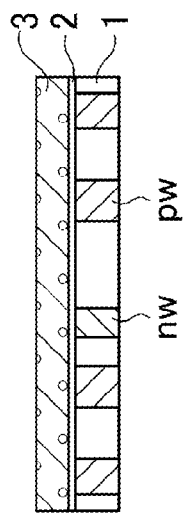
Figure 6A:
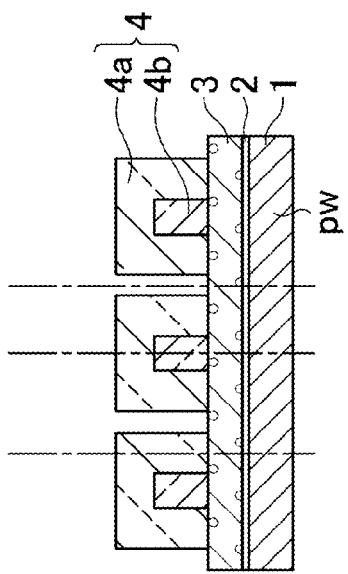
Figure 6B:
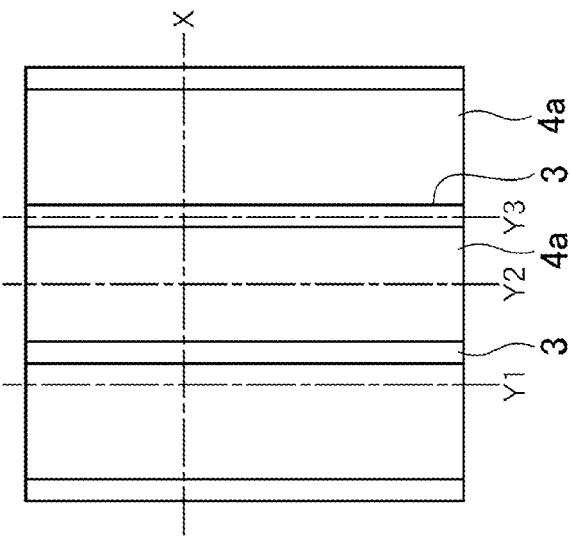
Figure 8C:
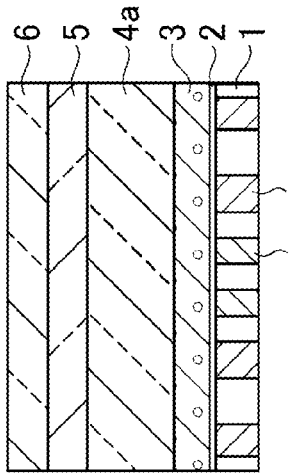
Figure 8D:
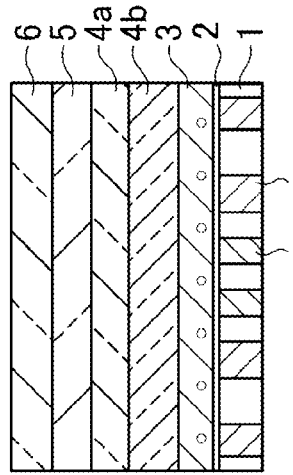
Figure 8E:
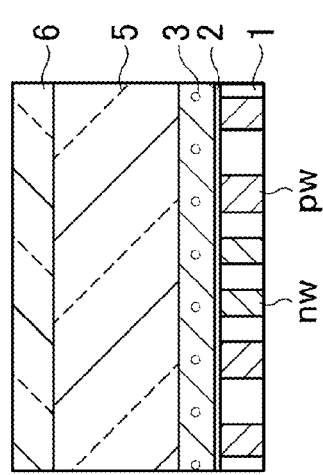
Figure 8A:
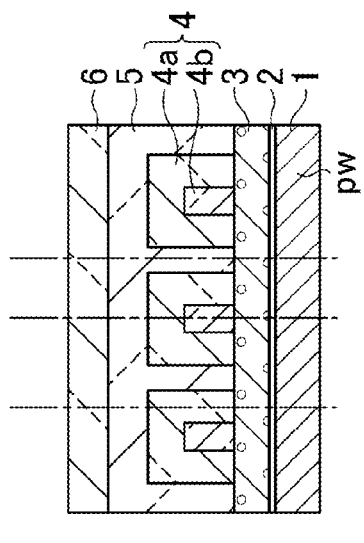
Figure 8B:
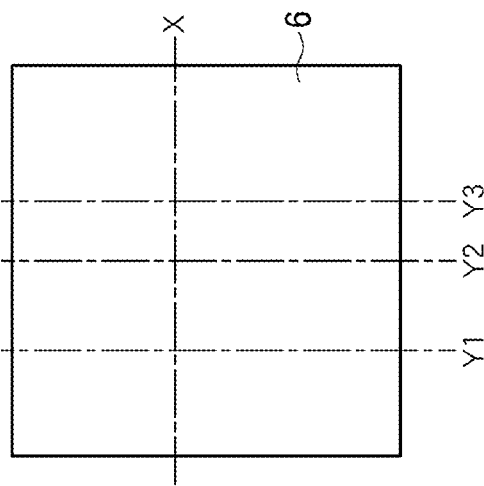
Figure 9A:
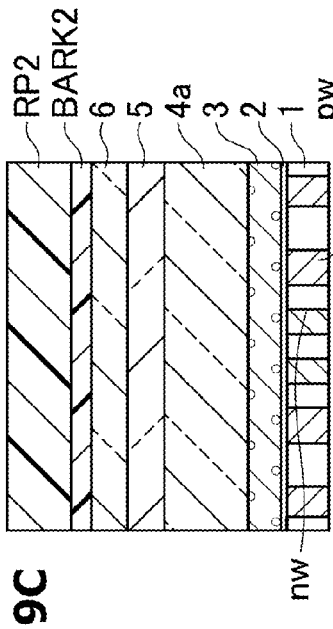
Figure 9B:
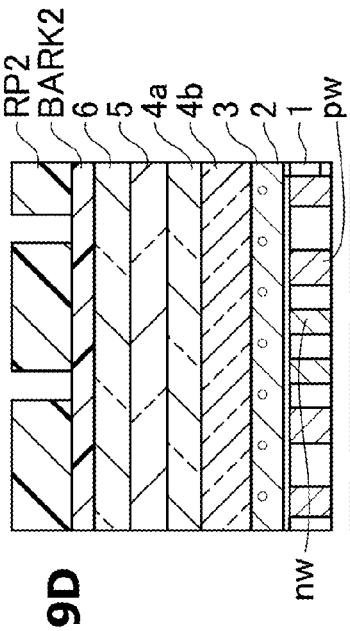
Figure 9C:
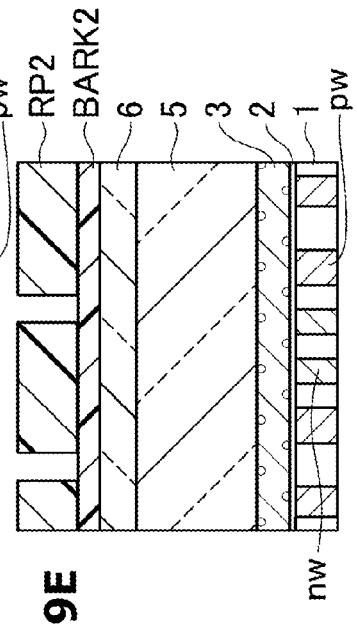
Figure 9D:
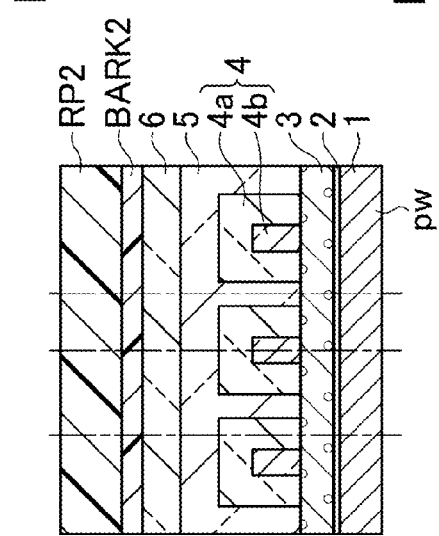
Figure 9E:
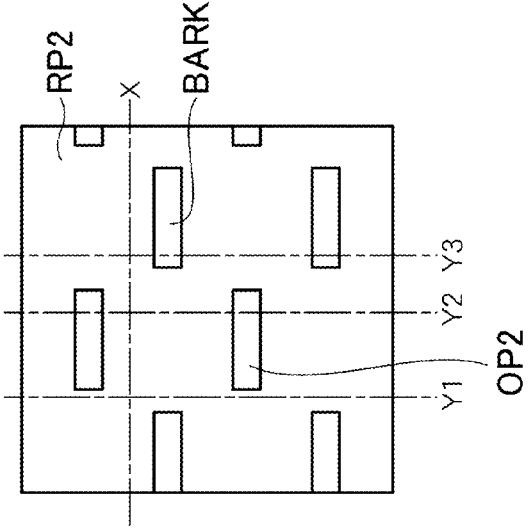
Figure 10C:
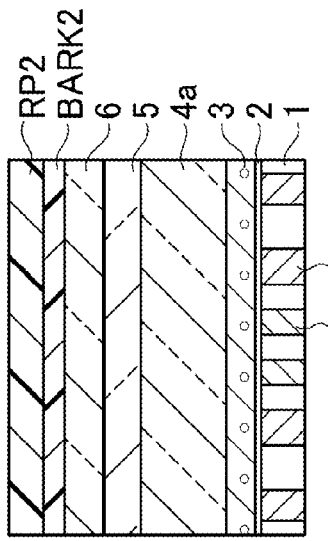
Figure 10D:
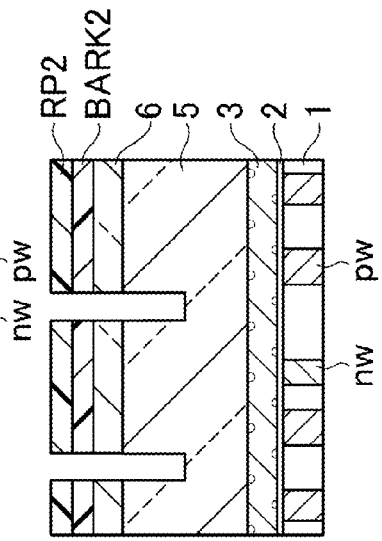
Figure 10E:
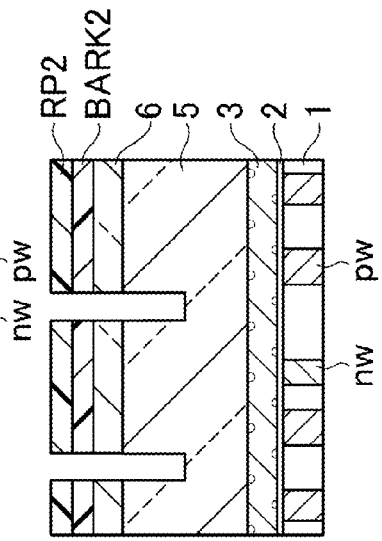
Figure 10A:
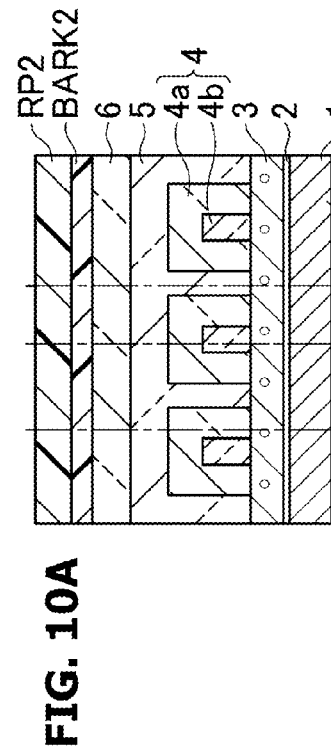
Figure 10B:
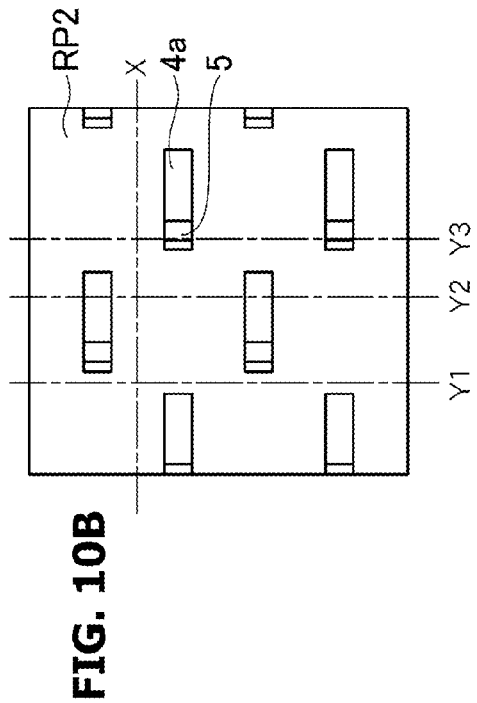
Figure 11A:
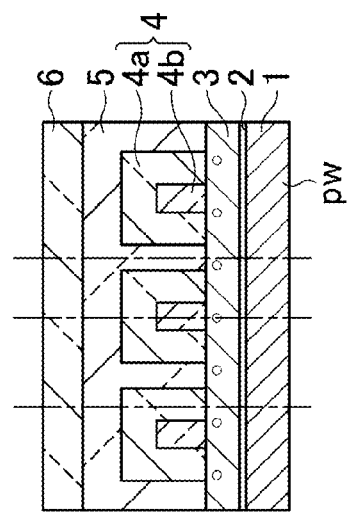
Figure 11B:
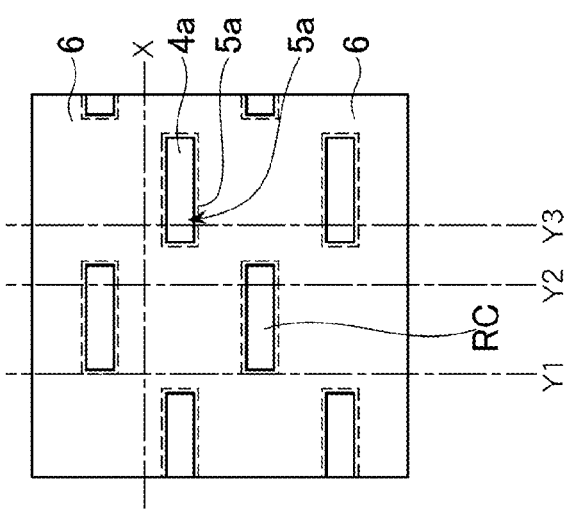
Figure 11C:
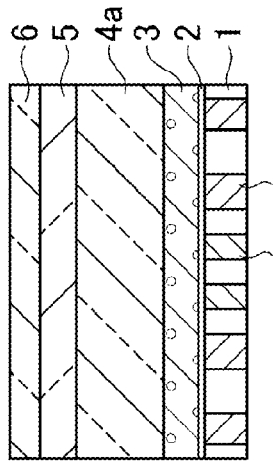
Figure 11D:
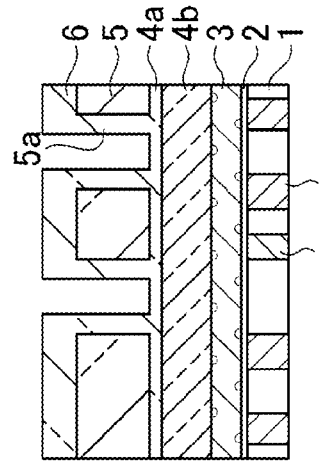
Figure 11E:
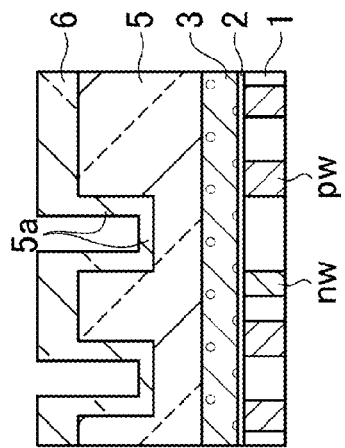
Figure 12C:
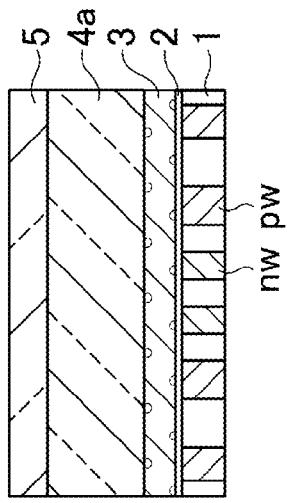
Figure 12D:
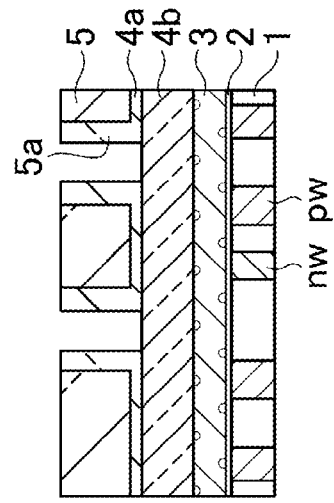
Figure 12E:
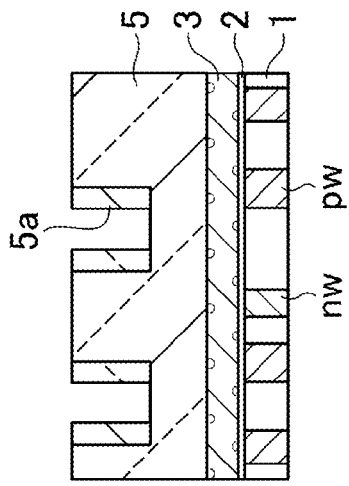
Figure 12A:
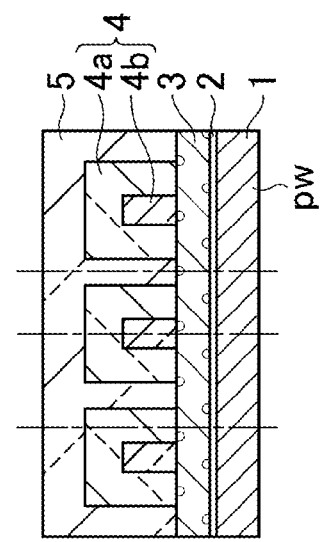
Figure 12B:
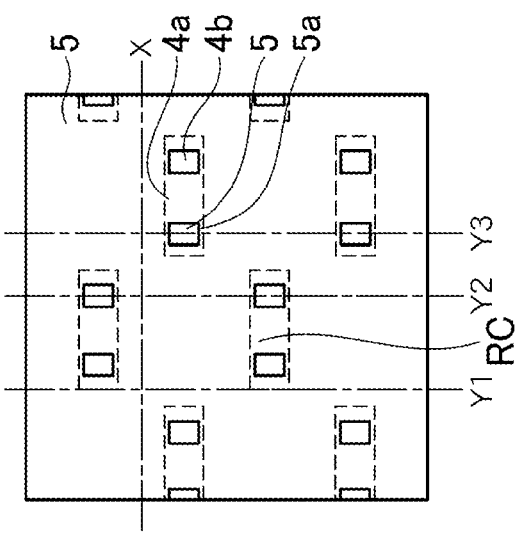

A width of each portion of the patterned mask film 4 is, e.g., 190 nm, a total width of the transformed layers 4a on both side walls is, e.g., 140 nm, and a width of the non-transformed portion 4b is, e.g., 50 nm (refer to FIG. 6A). Namely, a width of the transformed layer 4a to be formed on the side walls of the mask film 4 is selected so that a width of the non-transformed portion 4b becomes a gate electrode width, e.g., 50 nm.

For example, a height of the non-transformed portion 4b to be used as a mask for etching the gate electrode film 3 of 100 nm thick is preferably 70 nm or higher. To this end, a thickness of the mask film 4 is selected so that a height of the non-transformed portion 4b after the plasma process becomes, e.g., 100 nm to 70 nm, and a thickness of the transformed layer 4a on the upper plane of the mask film 4 is, e.g., 0 nm to 30 nm.

Reference is made to FIG. 7. A mask film 5 is formed on the gate electrode film 3 covering the patterned mask film 4 (covering the upper plane and side walls of each portion of the mask film 4). The mask film 5 is made of, e.g., the same material as that of the mask film 4. The mask film 5 is, e.g., a SiCOH film formed by coating NCS by spin coating, and has a thickness of, e.g., 200 nm.

Reference is made to FIG. 8. For example, a $SiO_2$ film 6 of 30 nm thick is deposited on the mask film 5 by CVD.

Reference is made to FIG. 9. An antireflection film BARK2 of organic material is formed on the $SiO_2$ film 6 by coating. A photoresist film is formed on the antireflection film BARK2 by coating. A pattern is transferred to the photoresist film by photolithography to form a resist pattern RP2.

The resist pattern RP2 is used for forming a mask for patterning gate electrodes in a length direction (Y-direction) of the gate electrode. As illustrated in 9B, the resist pattern RP2 has openings OP2 elongated in the width direction(X-direction) of the gate electrode. Each gate electrode is partitioned in the Y-direction sandwiching the opening portion OP2 so as to form a desired SRAM circuit.

Reference is made to FIG. 10. By using the resist pattern RP2 as a mask, etching is performed until the upper plane of the transformed layer 4a is exposed. First, by using the resist pattern RP2 as a mask, the antireflection film BARK2 is etched, and by using the resist pattern RP2 and antireflection film BARK2 as a mask, the $SiO_2$ film 6 is etched, and the mask film 5 is etched until the upper plane of the transformed layer 4a is exposed.

For example, the $SiO_2$ film 6 and mask film 5 are etched by using a diode parallel plate dry etching system in a vacuum chamber. A substrate temperature during etching is set to about 25° C. The $SiO_2$ film 6 is etched, for example, by the etching condition for $SiO_2$ described below. The mask film 5 is etched, for example, by the etching condition for SiCOH described below.

In this embodiment, the material of the mask film 4 and mask film 5 is SiCOH, and the material of the transformed layer 4a, transformed layer 5a of a mask film 5 to be described later and the $SiO_2$ film 6 is $SiO_2$. Selective etching for SiCOH and $SiO_2$ may be performed, for example, by the following conditions.

Etching gas for etching $SiO_2$ may be mixture gas of, e.g., $C_4F_6$, $O_2$ and Ar. More specifically, gas ratio is set to a combination of 5 to 30, 5 to 100 and 0 to 1000 in the order of $C_4F_6$, $O_2$ and Ar, and a total flow rate of the mixture gas is set in a range of 200 sccm to 1000 sccm. A pressure in the chamber is set to, e.g., 10 mTorr to 300 mTorr. A frequency of a radio frequency power to be applied is set to, e.g., 13.56 MHz at about 100 W to about 1500 W. During etching, a mixture gas may be changed to a mixture gas of another combination.

Etching gas for etching SiOCH may be mixture gas of, e.g., $CF_4$, $CHF_3$ and Ar, similar to the etching conditions for the mask film 4 described with reference to FIG. 5. More specifically, gas ratio is set to a combination of 50 to 300, 10 to 100 and 0 to 1000 in the order of $CF_4 CHF_3$ and Ar, and a total flow rate of the mixture gas is set in a range of 200 sccm to 1000 sccm. A pressure in the chamber is set to, e.g., 10 mTorr to 300 mTorr. A frequency of a radio frequency power to be applied is set to, e.g., 13.56 MHz at about 100 W to about 1000 W. During etching, a mixture gas may be changed to a mixture gas of another combination.

Reference is made to FIG. 11. The resist pattern RP2 and antireflection film BARK2 are removed by ashing. With this ashing, the surface of the mask film 5 exposed in the recess RC formed by etching described with reference to FIG. 10 is transformed into $SiO_2$ to form the transformed layer 5a.

Reference is made to FIG. 12. $SiO_2$ on the whole surface is etched. $SiO_2$ is etched, for example, the above-described $SiO_2$ etching conditions. The $SiO_2$ film 6 outside the recess RC is removed and the mask film 5 under the $SiO_2$ film 6 is exposed (refer to FIGS. 12A and 12C). On the bottom of the recess RC, the transformed layer 4a on the upper plane of the mask film 4 is removed and the non-transformed portion 4b is exposed (refer to FIG. 12D), and the transformed layer 5a of the mask film 5 is removed, and the non-transformed portion of the mask film 5 is exposed (refer to FIG. 12E). The transformed layer 5a of the mask film 5 is left on the side walls of the recess RC because of anisotropy of dry etching.

Reference is made to FIG. 13. SiCOH on the whole surface is etched. Etching SiCOH is performed under the above-described SiCOH etching conditions. the mask film 5 formed on the mask film 4 is removed while the mask film 5 formed on the side walls of the mask film 4 is left.

The mask film 5 on the mask film 4 outside the recess RC is removed to expose the transformed layer 4a of the mask film 4 (refer to FIGS. 13A and 13C). The mask film 5 is etched to such a depth that a height of the mask film 5b left in each gap of the patterned mask film 4 (left on the side walls of the mask film 4) becomes flush with a height of the non-transformed portion 4b of the mask film 4 (refer to FIG. 13A).

Inside the recess RC, the non-transformed portion 4b of the mask film 4 exposed on the bottom is removed (refer to FIG. 13D), and the mask film 5 is removed (refer to FIG. 13E) to expose the gate electrode film 3.

Reference is made to FIG. 14. $SiO_2$ on the whole surface is etched. $SiO_2$ is etched, e.g., wet etching by hydrofluoric acid, or dry etching under the above-described etching conditions. Even wet etching by hydrofluoric acid of, e.g., a 0.5% concentration, selective etching of a selection ratio of about 5 of $SiO_2$ to SiOCH is possible.

This etching removes all of the transformed layers 4a on the upper plane and side walls of the mask film 4 and the transformed layer 5a of the mask film 5. A mask pattern by the non-transformed portion 4b of the mask film is left, and a mask pattern by the mask film 5b formed in each gap of the patterned mask film 4 is left.

As described with reference to FIG. 6, each portion of the side walls of the mask film 4 patterned by the resist pattern RP1 is transformed to form the mask 4b of the non-transformed layer inside the transformed layer 4a on the side walls.

As described with reference to FIG. 7, as the mask film 5 is formed covering the patterned mask film 4, the mask 5b is formed in each gap of the mask film 4.

A width of the gap between adjacent masks 4b and 5b is each to a thickness of the transformed layer 4a on the side walls of the mask film 4. The transformed layer 4a on the side walls of the mask film 4 functions as a spacer for determining the gap with of the adjacent masks 4b and 5b.

The masks 4a and 5b are formed in this manner to pattern the gate electrodes in a width direction (gate length direction).

According to the embodiment, photolithography processes become easy. For example, gate electrodes are patterned in a gate electrode width direction (gate length direction) by one patterning process using the resist pattern RP1. A pitch of the resist pattern RP1 may be made bold twice a pitch of the final patterns by the masks 4b and 5b (it is possible to form a fine mask pattern reducing a pitch of a photolithograph process by a half). Further, for example, by adjusting a thickness of the transformed layer 4a on the side walls of the mask film 4, it becomes easy to adjust a gap width between the masks 4b and 5b and a width of the mask 4b. It is easy to control a mask pattern.

One of the masks 4b and 5b will not become a mask made of different raw material and a different lamination structure. Since the masks 4b and 5b can be made of the same material and the same structure, uniformity of patterning processes is improved.

Figure 14C:
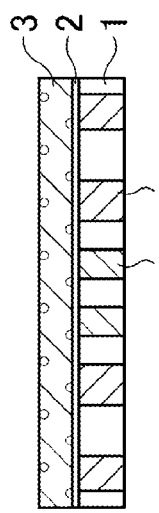
Figure 14D:
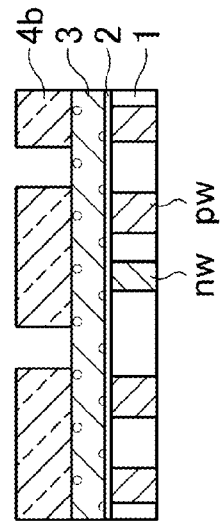
Figure 14E:
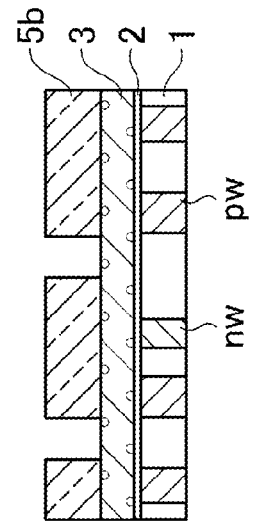
Figure 14A:
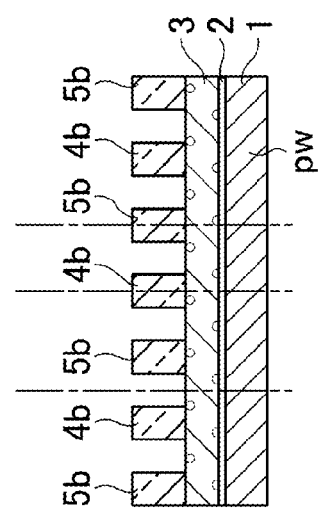
Figure 14B:
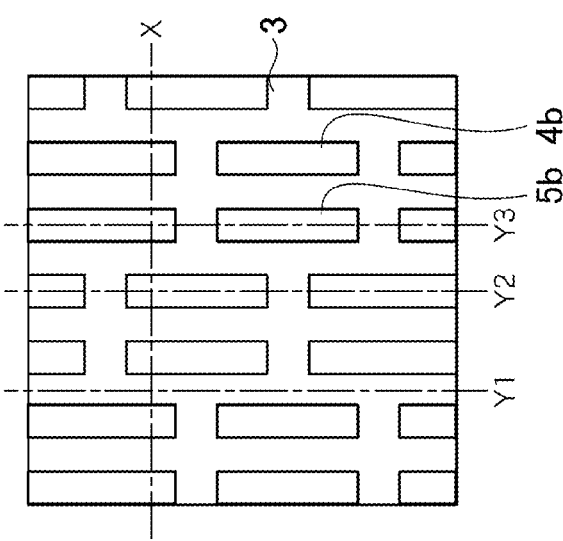
Figure 15C:
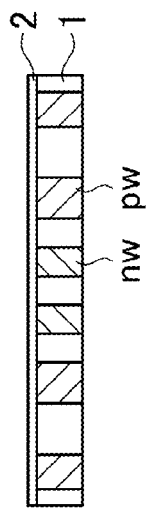
Figure 15D:
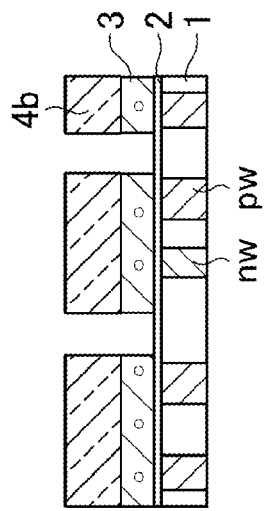
Figure 15E:
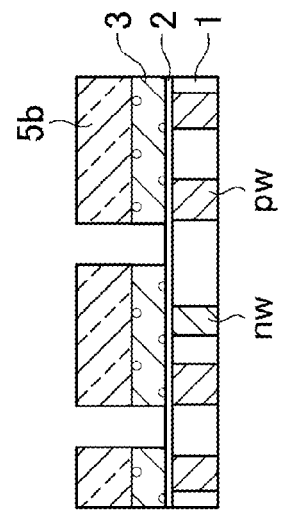
Figure 15A:
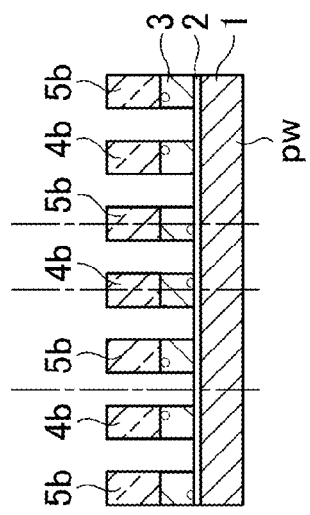
Figure 15B:
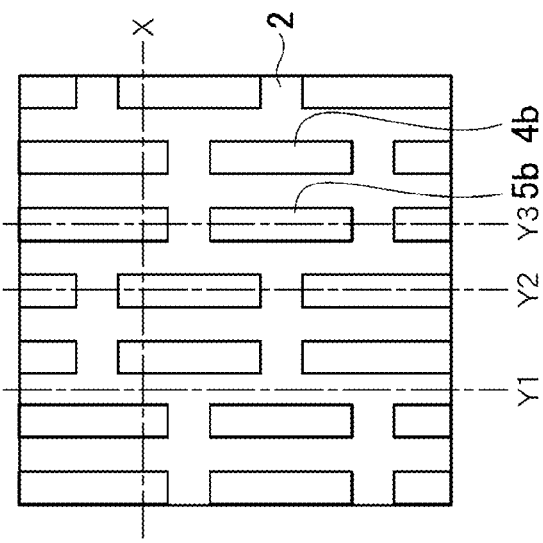
Figure 17C:
Figure 17D:
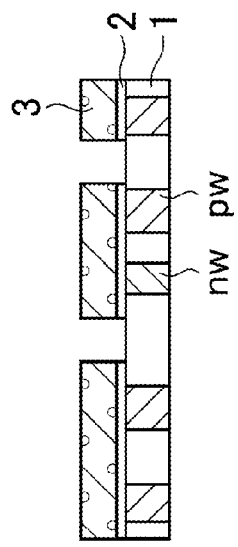
Figure 17E:
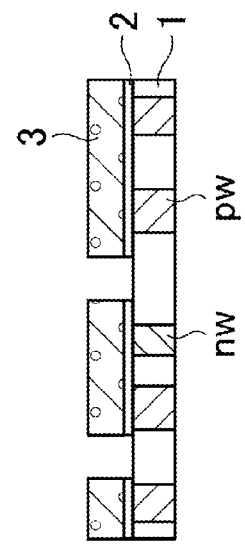
Figure 17A:
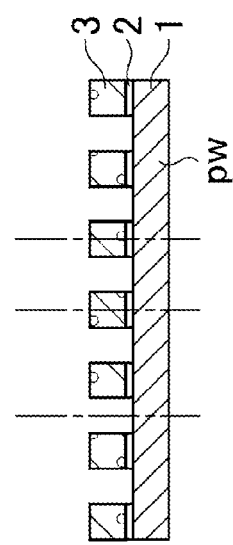
Figure 17B:
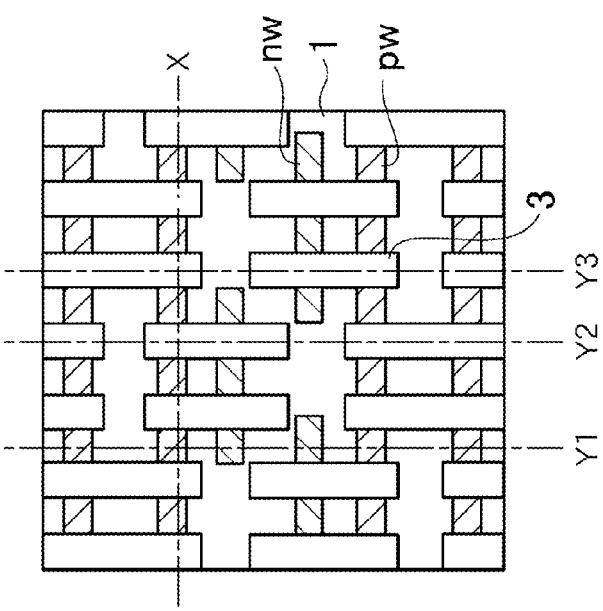
Figure 18E:
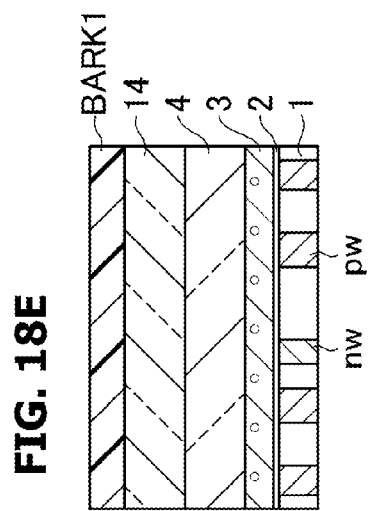
Figure 18D:
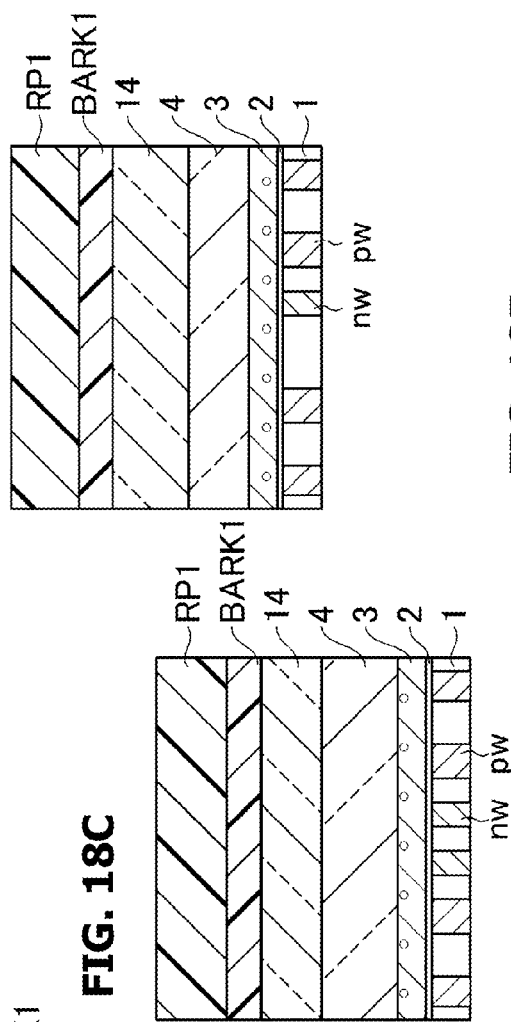
Figure 18C:
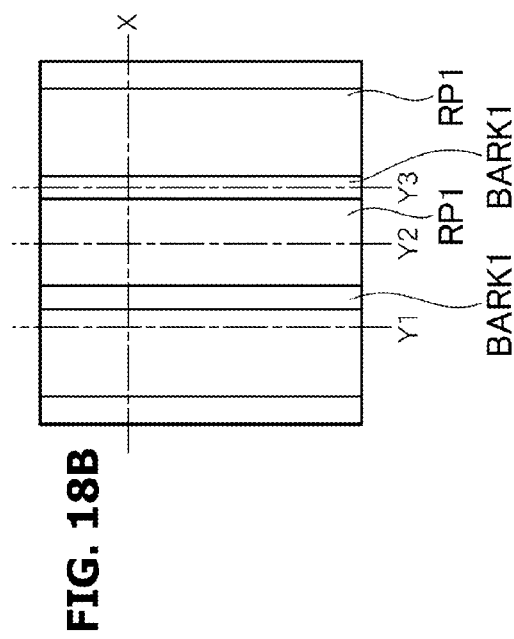
Figure 18A:
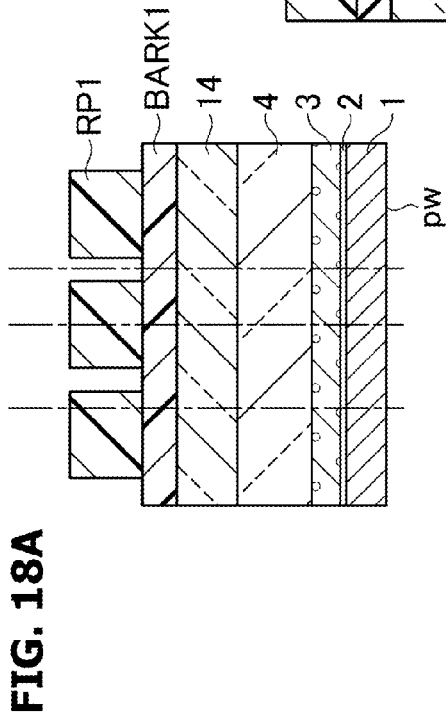
Figure 18B:
Figure 19C:
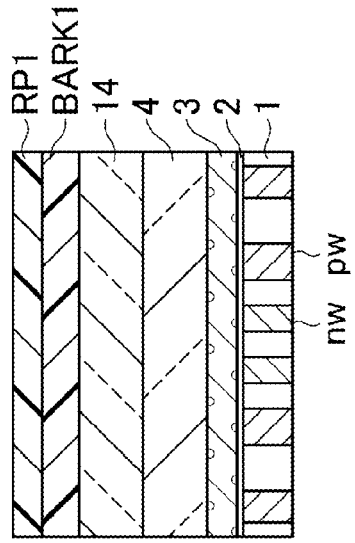
Figure 19D:
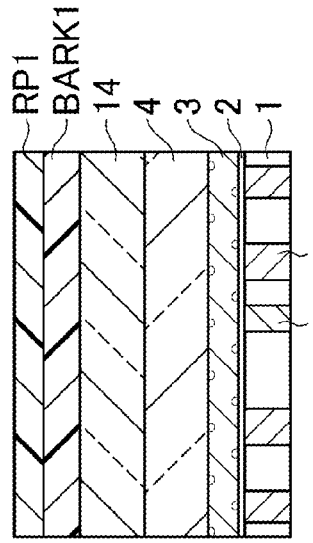
Figure 19E:
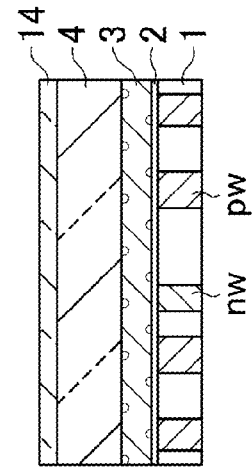
Figure 19A:
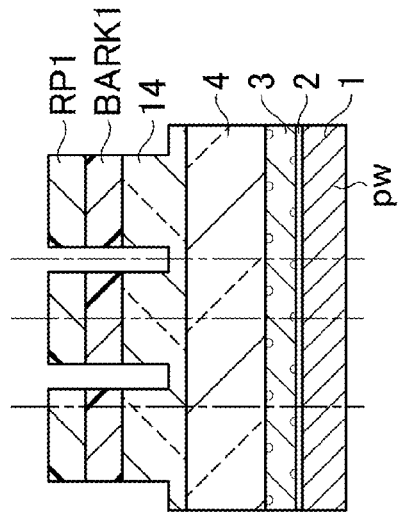
Figure 19B:
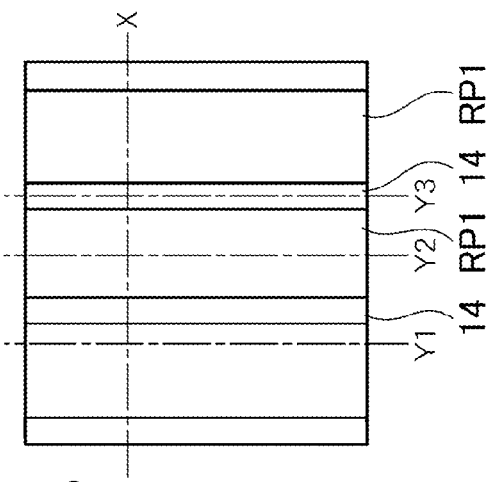
Figure 20A:
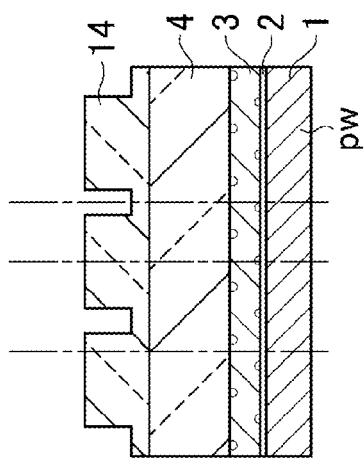
Figure 20B:
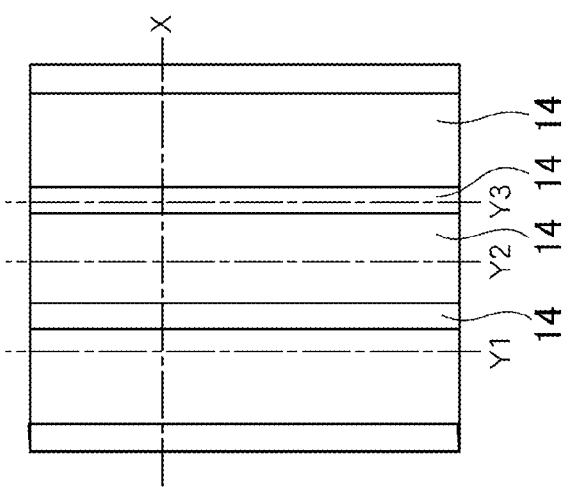
Figure 20C:
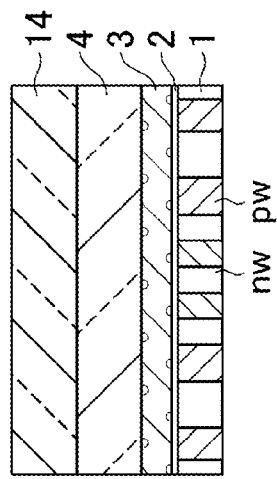
Figure 20D:
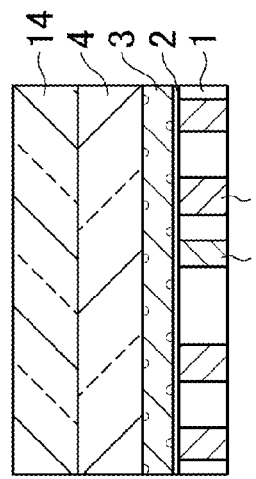
Figure 20E:
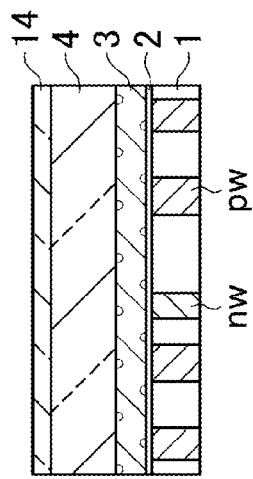
Figure 21C:
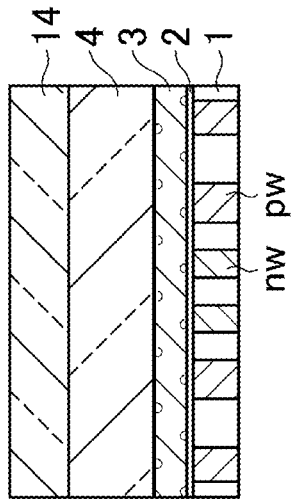
Figure 21D:
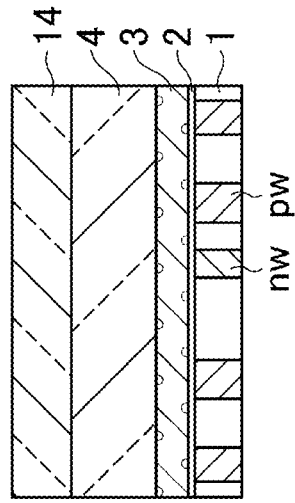
Figure 21E:
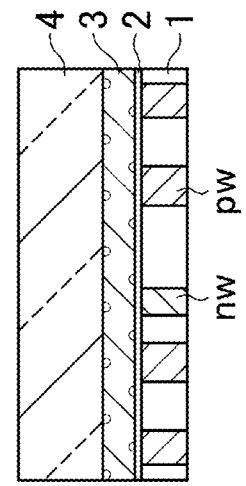
Figure 21A:
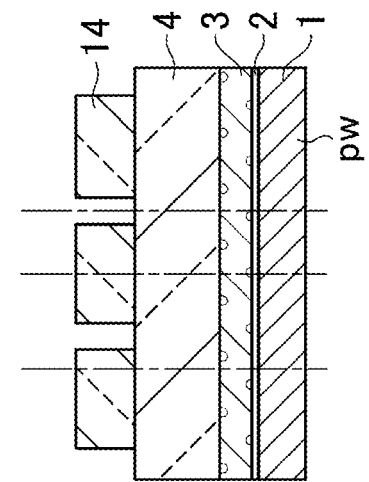
Figure 21B:
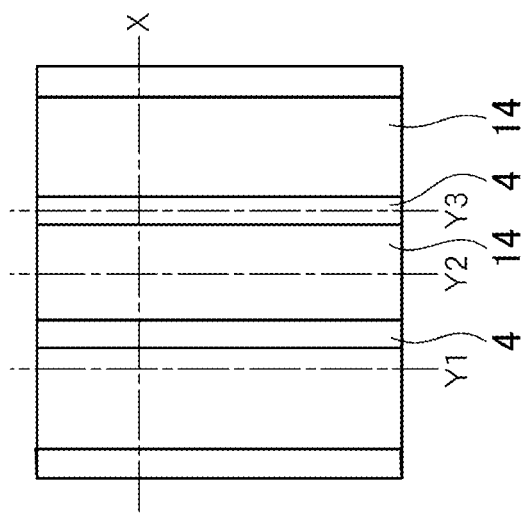
Figure 22C:
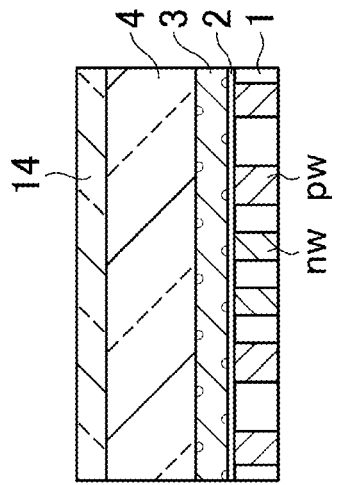
Figure 22D:
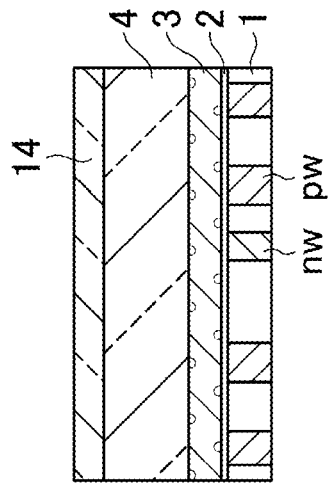
Figure 22E:
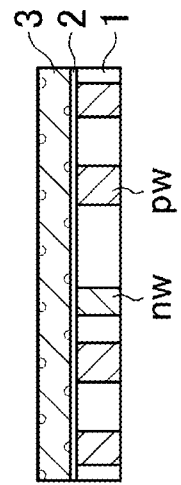
Figure 22A:
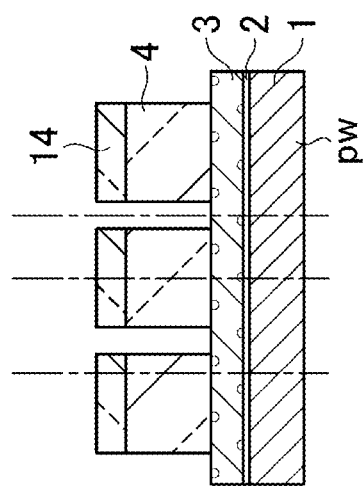
Figure 22B:
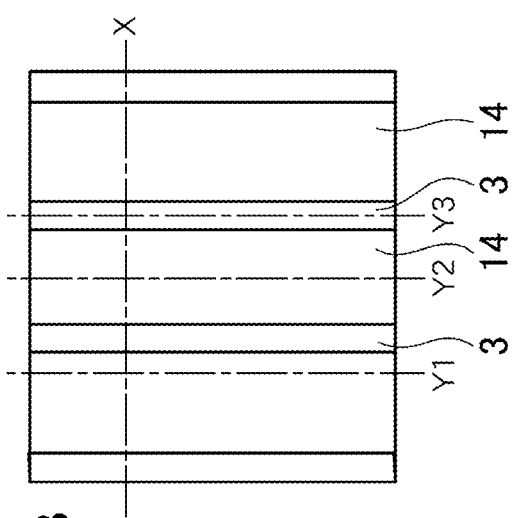

As illustrated in FIGS. 14D and 14E, the masks 4b and 5b are partitioned at desired positions in the gate electrode length direction (gate width direction).

As described with reference to FIG. 13, by using the resist pattern RP2, the non-transformed portion of the mask films 4 and 5 may be removed at desired partitioned positions in a gate electrode length direction. It is possible to give the masks 4b and 5b desired patterns in the gate electrode length direction (gate width direction).

If all the resist pattern RP2 and antireflection films BARK2 are able to be removed by etching the $SiO_2$ films 6 and mask film 5 described with reference to FIG. 10, ashing described with reference to FIG. 11 is not necessary. In this case, although the transformed layer 5a of the mask film 5 is not formed inside the recess RC, the processes illustrated in FIGS. 12 to 14 are performed in a similar manner.

Reference is made to FIG. 15. BY using the patterns of the masks 4b and 5b, the gate electrode film 3 is etched.

Reference is made to FIG. 16. The masks 4b and 5b are transformed by the plasma process by an oxygen containing gas like the process described with reference to FIG. 6 to form the transformed masks 4a and 5a. The plasma process time is set so that all portions of the masks 4b and 5b are transformed.

Reference is made to FIG. 17. $SiO_2$ on the whole surface is removed, for example, wet etching by hydrofluoric acid. This etching removes the transformed masks 4a and 5a and the gate insulating film 2 exposed outside the gate electrode 3. The gate electrodes 3 are therefore formed. As the masks 4b and 5b are transformed, the masks are removed by wet etching together with the unnecessary gate insulating films 2.

Thereafter, by using heretofore known techniques, p-type impurities are introduced into the n-type wells nw to form p-type MOS transistors, and n-type impurities are introduced into the p-type wells pw to form n-type MOS transistors. An upper wiring structure is further formed. The semiconductor device of the first embodiment is therefore formed.

Next, description will be made on the semiconductor device manufacture method of the second embodiment. In the first embodiment, the side walls of the mask film 4 are transformed into the transformed layers 4a by using the ashing for removing the resist pattern RP1 and antireflection film BARK1 as described with reference to FIG. 6. In the second embodiment, as described below a process of removing the resist pattern RP1 and antireflection film BARK1 and a process of transforming the side walls of the mask film 4 into the transformed layer 4a are executed independently.

First, the mask film 4 on the gate electrode film 3 is formed by a method similar to the process described with reference to FIG. 3 of the first embodiment. In the second embodiment, same reference symbols as those of the first embodiment will be used for those having definite correspondence relation to the first embodiment.

Reference is made to FIG. 18. An SiO$_2$ film 14, for example, of 10 nm to 30 nm thick is formed on the mask film 4 by CVD. An antireflection film BARK1 of organic material is formed on the SiO$_2$ film 14 by coating. A photoresist film is formed on the antireflection film BARK1 by coating. A pattern is transferred to the photoresist film by photolithography to form a resist pattern RP1. A different point from the first embodiment resides in that the SiO$_2$ film 14 is sandwiched between the mask film 4 and antireflection film BARK1.

Reference is made to FIG. 19. By using the resist pattern RP1 as a mask, the antireflection film BARK1 is etched, and by using the resist pattern RP1 and antireflection film BARK1 as a mask, the SiO2 film 14 is etched to an intermediate depth. This etching is performed, e.g., under the above-described SiO$_2$ etching conditions.

Reference is made to FIG. 20. The resist pattern RP1 and antireflection film BARK1 are removed by ashing. Since the mask film 4 is covered with the SiO$_2$ film 14, this ashing will not form the transformed layer on the mask film 4.

Reference is made to FIG. 21. Etching the SiO$_2$ film 14 to the intermediate depth described with reference to FIG. 19 is further performed to the full thickness to expose the mask film 4 on the bottom of the recess corresponding to the opening of the resist pattern RP1. This etching is performed, e.g., under the above-described SiO$_2$ etching conditions.

Reference is made to FIG. 22. By using the SiO$_2$ film 14 as a mask, the mask film 4 is etched until the gate electrode film 3 is exposed. This etching is performed, e.g., under the above-described SiCOH etching conditions.

Reference is made to FIG. 23. In the state that the SiO$_2$ film 14 is formed on the mask film 4, a plasma process using oxygen-containing gas is executed to transform the mask film 4. The upper plane of the mask film 4 will not be transformed, but the side walls of the mask film 4 are transformed into the transformed layer 4a. The plasma process conditions are, for example, similar to the conditions described with reference to FIG. 6 of the first embodiment. The plasma process time is set in such a manner that the transformed layer 4a has a desired thickness, i.e., that the non-transformed portion 4b has a desired width.

In the second embodiment, the upper portion of the mask film 4 is not transformed because it is covered with the SiO$_2$ film 14. A height of the mask 4b is determined therefore by a thickness of the mask film 4 when it is form. It is not necessary to control a thickness of the transformed layer on the upper plane of the mask film 4.

Since the material of the SiO$_2$ film 14 is SiO$_2$ similar to the transformed layer of the mask film 4, the SiO$_2$ film 14 functions in a manner similar to the transformed layer 4a formed on the upper plane of the mask film 4.

The processes to follow of the second embodiment are performed in a manner similar to the process illustrated in FIG. 7 and the following processes, by reading the transformed layer 4a formed on the upper plane of the mask film 4 in the first embodiment as the SiO$_2$ film 14.

In the process of etching SiCOH on the whole surface corresponding to the process of the first embodiment described with reference to FIG. 13, a height of the mask film 5b left between portions of the patterned mask film 4 is made flush with a height of the mask film 4 when it is formed.

In the process of etching SiO$_2$ on the whole surface corresponding to the process of the first embodiment described with reference to FIG. 14, the transformed layer 4a on the side walls of the mask film 4 is removed together with the cover film 14 formed on the mask film 4.

As described in the first and second embodiments, the side walls of the patterned mask film is transformed into the transformed layer 4a by the reactive plasma process, the non-transformed portion 4b is left inside the transformed layer 4a, the mask film 5b is formed outside the transformed layer 4a, and the transformed layer 4a is removed. In this manner, it is possible to form a mask pattern in which the non-transformed portion 4b of the mask film 4 and the mask film 5b are juxtaposed sandwiching the transformed layer forming region.

In the first and second embodiments, the side walls of the mask film 4 made of silicon containing material are changed to silicon oxide by the plasma process by an oxygen containing gas to form the transformed layers 4a. Although the SiCOH film capable of being coated is used as an example of the material of the mask film 4, the material of the mask film 4 is not limited thereto.

For example, various types of porous SiCOH, SiOC, and SiC films capable of being formed by CVD have been developed as low dielectric material. Some of them are capable of forming the transformed layer, for example, by the oxygen plasma process, and are capable of being used as the material of the mask film 4. It is expected that the plasma process conditions and the like for controlling a thickness of the transformed layer may be found by experiments. There is a possibility that polysilicon may be used as the material of the mask film 4.

It is not essential to use the same material for the masks 5b and 4b and to set the same height for the masks 5b and 4b, from the viewpoint of forming the mask 5b. It is however preferable to use the same material for the masks 5b and 4b and to set the same height for the masks 5b and 4b, from the viewpoint of improving patterning process uniformity using a mask pattern of a set of masks 4b and 5b.

It is not essential to transform the mask film 5 into the transformed layer. In the first embodiment, if all of the resist pattern RP2 and antireflection film BARK2 are able to be removed by the process of etching the SiO$_2$ film 6 and mask film 5 described with reference to FIG. 10, ashing described with reference to FIG. 11 is not necessary. In this case, the transformed layer 5a of the mask film 5 is not formed.

In the etching processes of using the resist pattern RP1 as a mask and using the resist pattern RP2 as a mask, the antireflection films BARK1 and BARK2 are used in the embodiments. However, it does not mean that the antireflection film is essential for etching.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device manufacture method comprising:

forming a first film above a semiconductor substrate;
   forming a first mask film above the first film;
   patterning the first mask film;

executing a plasma process using an oxygen-containing gas for a side wall of the patterned first mask film to transform the side wall into a silicon oxide layer;

after the plasma process, forming a second mask film covering the first mask film;

etching the second mask film to remove the second mask film above the first mask film and leave the second mask film formed on the side wall;

after the etching the second mask film, removing the silicon oxide layer; and after the removing the silicon oxide layer, etching the first film by using the first mask film and the second mask film as mask.

2. The semiconductor device manufacture method according to claim 1, wherein the first mask film is a porous film.

3. The semiconductor device manufacture method according to claim 2, wherein the first mask film is made of SiCOH, SiOC or SiC.

4. The semiconductor device manufacture method according to claim 1, wherein the first mask film is made of SiCOH, SiOC or SiC.

5. The semiconductor device manufacture method according to claim 1, wherein:

the patterning the first mask film includes forming a resist pattern above the first mask film and etching the first mask film by using the resist pattern as mask; and the plasma process removes the resist pattern and forms the silicon oxide.

6. The semiconductor device manufacture method according to claim 5, wherein:

the plasma process converts the side wall of the first mask film into the silicon oxide layer, and converts an upper portion of the first mask film into a silicon oxide layer; and the removing the silicon oxide layer removes the silicon oxide layer on the side wall of the first mask film, and removes the silicon oxide layer on the upper portion of the first mask film.

7. The semiconductor device manufacture method according to claim 1, wherein:

the patterning the first mask film includes forming a cover film on the first mask film, patterning the cover film and etching the first mask film by using the cover film as mask; and the plasma process is performed in a state that an upper portion of the first mask film is covered with the cover film.

8. The semiconductor device manufacture method according to claim 7, wherein:

the cover film is made of a same material as the silicon oxide layer; and the removing the silicon oxide layer removes the silicon oxide layer, and also removes the cover film.

9. The semiconductor device manufacture method according to claim 1, wherein:

the patterning the first mask film includes forming a cover film on the first mask film, patterning the cover film and etching the first mask film by using the cover film as mask; and the plasma process is performed in a state that an upper portion of the first mask film is covered with the cover film.

10. The semiconductor device manufacture method according to claim 9, wherein the patterning the first mask film further includes forming a resist pattern above the cover film, etching the cover film to an intermediate thickness by using the resist pattern as mask, removing the resist pattern by a plasma process with an oxygen-containing gas in a state that the cover film is etched to an intermediate thickness, and after removing the resist pattern, further etching the cover film to expose the first mask film.

11. The semiconductor device manufacture method according to claim 1, wherein the first mask film and the second mask film are made of a same material.

12. The semiconductor device manufacture method according to claim 1, wherein the etching the second mask film removes the second mask film in such a manner that a height of a left portion of the second mask film becomes flush with a height of a portion of the first mask film left by the removing the silicon oxide layer.

13. The semiconductor device manufacture method according to claim 1, wherein:

the first film is a conductive film; and the etching the first film patterns the conductive film to form a gate electrode of a MOS transistor.

14. The semiconductor device manufacture method according to claim 1, further comprising:

forming a gate insulating film of silicon oxide on the semiconductor substrate;

wherein:

the forming the first film forms the first film of conductive material above the gate insulating film;

the etching the first film forms a gate electrode; and the second mask film is made of silicon-containing material; the method further comprising:

after the etching the first film, transforming a whole portion of the first mask film and the second mask film into silicon oxide; and removing the transformed first mask film and second mask film and removing the gate insulating film except for the gate insulating film underneath the gate electrode.

15. The semiconductor device manufacture method according to claim 14, wherein the removing the transformed first mask film and second mask film and the removing the gate insulating film except for the gate insulating film underneath the gate electrode removes the first mask film, the second mask film and the gate insulating film by wet etching.

16. A semiconductor device manufacture method comprising:

forming a first film above a semiconductor substrate;

forming a first mask film containing silicon above the first film;

patterning the first mask film into a plurality of portions juxtaposed at an interval;

executing a plasma process using an oxygen-containing gas for a side wall of the patterned of the first mask film to transform the side walls into silicon oxide layer;

after the plasma process, forming a second mask film covering the first mask film portions;

etching the second mask film to remove the second mask film above the first mask film portions and leave the second mask film at the interval between the first mask film portions;

after the etching the second mask film, removing the silicon oxide layers; and after the removing the silicon oxide layer, etching the first film by using the first mask film and the second mask film as mask.

17. The semicondonductor device manufacture method according to claim 16, wherein:

the interval has a width; and in the etching the first film, a left portion of the second mask film has the first width and a width and a left portion of the mask film has the first width.

18. The semiconductor device manufacture method according to claim 17,wherein:

a plasma process time is so selected that the left portion of the first mask film has the first width.

* * * * *